(12) United States Patent
Wehlus

(10) Patent No.: US 9,978,996 B2
(45) Date of Patent: May 22, 2018

(54) METHOD FOR PRODUCING AN OPTOELECTRONIC COMPONENT

(71) Applicant: Osram OLED GmbH, Regensburg (DE)

(72) Inventor: Thomas Wehlus, Lappersdorf (DE)

(73) Assignee: Osram OLED GmbH, Regensburg (DE)

( * ) Notice: Subject to any disclaimer, the term of this patent is extended or adjusted under 35 U.S.C. 154(b) by 4 days.

(21) Appl. No.: 15/322,738

(22) PCT Filed: Jul. 17, 2015

(86) PCT No.: PCT/EP2015/066406
§ 371 (c)(1),
(2) Date: Dec. 29, 2016

(87) PCT Pub. No.: WO2016/012364
PCT Pub. Date: Jan. 28, 2016

(65) Prior Publication Data
US 2017/0155096 A1  Jun. 1, 2017

(30) Foreign Application Priority Data

Jul. 22, 2014  (DE) .................. 10 2014 110 268

(51) Int. Cl.
*H01L 51/56* (2006.01)
*H01L 51/00* (2006.01)
(Continued)

(52) U.S. Cl.
CPC ............ *H01L 51/56* (2013.01); *H01L 51/003* (2013.01); *H01L 51/0097* (2013.01);
(Continued)

(58) Field of Classification Search
CPC ... H01L 51/003; H01L 51/0097; H01L 51/56; H01L 2924/15788
See application file for complete search history.

(56) References Cited

U.S. PATENT DOCUMENTS 7,897,482 B2 * 3/2011 Toriumi .............. H01L 27/1214
257/E21.6
7,968,382 B2 * 6/2011 Jinbo ................ H01L 29/66969
257/E21.57
(Continued)

FOREIGN PATENT DOCUMENTS

| JP | 2011227205 A | 11/2011 |
|---|---|---|
| JP | 2013149713 A | 8/2013 |
| WO | 2014032931 A1 | 3/2014 |

OTHER PUBLICATIONS

German Search Report based on application No. 10 2014 110 268.1 (9 pages) dated Jul. 13, 2014 (for reference purpose only).
(Continued)

*Primary Examiner* — Daniel Luke

(57) ABSTRACT

In various exemplary embodiments, a method for producing an optoelectronic component is provided. In this case, a high temperature solid is provided which is stable at least up to a predefined first temperature. A liquid glass solder having a second temperature, which is lower than the first temperature, is applied to the high temperature solid in a structured fashion. The glass solder is solidified, as a result of which a glass solid is formed. An optoelectronic layer structure is formed above the glass solid. The glass solid and the optoelectronic layer structure form the optoelectronic component. The optoelectronic component is removed from the high temperature solid.

15 Claims, 5 Drawing Sheets

(51) Int. Cl.
*H01L 51/50* (2006.01)
*H01L 51/52* (2006.01)

(52) U.S. Cl.
CPC ........ *H01L 51/504* (2013.01); *H01L 51/5056* (2013.01); *H01L 51/5072* (2013.01); *H01L 51/5088* (2013.01); *H01L 51/5092* (2013.01); *H01L 51/5253* (2013.01); *H01L 2924/15788* (2013.01)

(56) References Cited

U.S. PATENT DOCUMENTS

| | | | |
|---|---|---|---|
| 8,222,116 B2 * | 7/2012 | Jinbo | H01L 27/1214 438/455 |
| 2005/0082971 A1 | 4/2005 | Couillard | |
| 2011/0012873 A1 | 1/2011 | Prest et al. | |
| 2011/0255034 A1 | 10/2011 | Nakano et al. | |
| 2015/0224744 A1 | 8/2015 | Neuhaeusler et al. | |

OTHER PUBLICATIONS

International Search Report based on application No. PCT/EP2015/066406 (7 pages) dated Nov. 23, 2015 (for reference purpose only).

* cited by examiner

METHOD FOR PRODUCING AN OPTOELECTRONIC COMPONENT

RELATED APPLICATIONS

The present application is a national stage entry according to 35 U.S.C. § 371 of PCT application No.: PCT/EP2015/066406 filed on Jul. 17, 2015, which claims priority from German application No.: 10 2014 110 268.1 filed on Jul. 22, 2014, and is incorporated herein by reference in its entirety.

TECHNICAL FIELD

Various embodiments relate to a method for producing an optoelectronic component.

BACKGROUND

Optoelectronic components, for example light emitting diodes (LEDs), organic light emitting diodes (OLEDs), or solar cells, are being used increasingly widely. In general lighting, for example, LEDs and OLEDs are being used increasingly as a surface light source. However, LEDs and OLEDs are increasingly making inroads in the automotive field as well.

An optoelectronic component may include an optoelectronic layer structure on a carrier. The optoelectronic layer structure may include an anode and a cathode with a functional layer system therebetween, an organic functional layer system in the case of an OLED. The organic functional layer system may include one or a plurality of emitter layers in which electromagnetic radiation is generated, a charge generating layer structure composed of in each case two or more charge generating layers (CGL) for charge generation, and one or a plurality of electron blocking layers, also designated as hole transport layer(s) (HTL), and one or a plurality of hole blocking layers, also designated as electron transport layer(s) (ETL), in order to direct the current flow.

The carrier can be formed in a flexible fashion, such that it is bendable simply and nondestructively. In OLED technology for flexible OLEDs, the choice of the correct material for the carrier is a major challenge. While plastic, for example PET, may not be sufficiently air- and watertight, metal is generally relatively rough and nontransparent. One solution is to use flexible glass, wherein the carrier may include glass or consist of glass. However, such a glass carrier is difficult to handle and to singulate in conventional production methods.

A flexible glass carrier can be produced in a float glass method, for example, wherein the liquid glass solder is applied to a viscous tin melt in a continuous method. The glass solder floats on the tin melt and spreads uniformly like a film. Afterward, the glass solder is cooled. After solidification, the glass solid formed by the glass solder is singulated. The singulation can be carried out by means of cutting or sawing, for example. The optoelectronic layer structure can be formed before or after singulation on the glass solid.

Furthermore, in the conventional production methods it is difficult to provide the flexible glass with a scattering layer for coupling out light and thus for increasing the efficiency of the optoelectronic component. By way of example, scattering particles can be applied to the finished glass carrier and the glass carrier can be heated beforehand, in the course of this or afterward in such a way that the scattering particles sink wholly or partly into the glass carrier and are embedded therein.

SUMMARY

Various embodiments provide a method for producing an optoelectronic component which is implementable simply and/or cost-effectively and/or which makes it possible in a simple manner for the optoelectronic component to be flexible, that is to say bendable simply and nondestructively, and/or to be particularly efficient and/or to include a glass carrier.

Various embodiments are achieved by means of a method for producing an optoelectronic component. The method involves providing a high temperature solid which is stable at least up to a predefined first temperature. A liquid glass solder having a second temperature, which is lower than the first temperature, is applied to the high temperature solid in a structured fashion. The glass solder is solidified, as a result of which a glass solid is formed. An optoelectronic layer structure is formed above the glass body. The glass body and the optoelectronic layer structure form the optoelectronic component. The optoelectronic component is removed from the high temperature solid.

Forming the glass solid on the high temperature solid enables simple detachment of the optoelectronic component and in particular of the glass solid from the high temperature solid. Moreover, forming the glass solid on the high temperature solid can make it possible to be able to dispense with singulating a plurality of glass solids for a corresponding plurality of optoelectronic components. This contributes in a simple manner to the fact that the method for producing the optoelectronic component is implementable simply and/or cost-effectively. Furthermore, the method makes it possible in a simple manner for the optoelectronic component to be flexible, that is to say bendable simply and nondestructively, since the glass solid can be formed particularly simply and reliably in a very thin fashion on the high temperature solid. Furthermore, scattering particles can be introduced into the glass solder in a simple manner, as a result of which the glass solid serves not only as a carrier for the optoelectronic layer structure but also as a coupling-out layer for increasing the efficiency of the optoelectronic component and the latter is therefore particularly efficient.

In particular, a major advantage of the method is that it is thereby possible to produce thin and/or scattering glass solids as a carrier, in particular without having to perform one or more complicated singulation processes. The combination of coupling-out layer, in particular scattering layer, and glass solid as carrier, in particular as flexible carrier, significantly reduces the complexity of the entire process chain of the method for producing the optoelectronic component compared with conventional production methods. The process simplification may reside in particular in the fact that the glass solids can remain on the high temperature solid for a particularly long time, in particular until the end of the production of the optoelectronic component. Detachment of the individual optoelectronic components from the high temperature solid may be carried out for example only after the encapsulation of the corresponding optoelectronic components. This has the effect, inter alia, that all component parts, in particular all optoelectronic components on the high temperature solid and/or the high temperature solid itself, are always positioned correctly with respect to one another.

The liquid glass solder, for example in the form of a glass paste, is applied to the high temperature solid in a structured fashion by being printed for example onto the high temperature solid, for example by means of screen printing. The fact that the glass solder is applied in a structured fashion means, for example, that the glass solder is not applied as a closed surface for a plurality of glass solids as carrier for a corresponding plurality of optoelectronic components, but rather as an individual structure for a respective optoelectronic component. By way of example, the glass solder can be applied in a structured fashion in such a way that the glass solid can serve as a carrier for the corresponding optoelectronic component without further processing, such as singulating, cutting and/or sawing. The glass solder and subsequently the glass solid can be formed for example such that they are scattering or non-scattering.

The glass solder can be solidified by being vitrified, dried and/or hardened, for example. By way of example, the glass paste already present on the high temperature solid in a structured fashion can be vitrified in a furnace process, wherein a continuous furnace or a batch process (batch operating) is conceivable. The second temperature, that is to say the temperature of the glass solder in a liquid state, can be in a range for example of 500° C. to 1200° C., for example of 500° C. to 800° C., for example of 520° C. to 650° C.

The high temperature solid is a plate having high thermal stability. The fact that the high temperature solid is stable up to the first temperature means, for example, that the high temperature solid does not deform plastically up to the first temperature. By way of example, the first temperature can be above the softening temperature and/or above the melting point of the high temperature solid. The first temperature can be in a range of, for example, 600° C. to 5000° C., for example of 600° C. to 1500° C., for example of 650° C. to 1000° C. Furthermore, the high temperature solid can have a particularly smooth surface at least in the region in which the glass solder is applied.

The method can be formed such that, finally, the finished optoelectronic component can be detached from the high temperature solid, for example after forming the encapsulation.

In accordance with one development, the high temperature solid, on account of its stability up to the first temperature, does not establish a cohesive connection with the glass solder and/or the glass solid. In addition, the high temperature solid and the glass solder can be formed with respect to one another such that in principle they do not establish a cohesive connection with one another. By way of example, the high temperature solid and the glass solid cannot adhere to one another. This can contribute to the fact that the high temperature solid can be removed from the glass solid and/or the corresponding optoelectronic component in a simple manner.

In accordance with one development, scattering particles are embedded into the liquid glass solder, and the embedded scattering particles together with the glass solder are applied to the high temperature solid. By way of example, the scattering particles can firstly be introduced into the glass solder and then the glass solder with the scattering particles can be applied to the high temperature solid. As an alternative thereto, the scattering particles can be introduced into the glass solder during the process of applying the glass solder or still before the process of solidifying the glass solder, for example by said scattering particles being applied to said glass solder and then sinking into the still liquid glass solder. This can contribute in a simple manner to forming the glass solid as a coupling-out layer and/or to the fact that the efficiency of the optoelectronic component is particularly high.

In accordance with one development, the glass solder is applied to the high temperature solid such that the glass solid is isolated on the high temperature solid. In other words, an isolated glass solid is formed by means of applying the glass solder to the high temperature solid. The fact that the glass solid is isolated can mean, for example, that it has no direct physical connection to an adjacent glass solid on the high temperature solid and/or that it does not touch the adjacent glass solid. The glass solid can thus be formed as an isolated glass solid, for example as an isolated glass film. This makes it possible that a singulation step for singulating the glass solid and/or the corresponding optoelectronic component can be dispensed with.

In accordance with one development, the high temperature solid includes or consists of graphite. This can contribute in a simple manner to the fact that the high temperature solid is stable up to the first temperature.

In accordance with one development, the high temperature solid includes or consists of ceramic. This can contribute in a simple manner to the fact that the high temperature solid is stable up to the first temperature.

Alternatively or additionally, the high temperature solid may include or consist of $Al_2O_3$. This can contribute in a simple manner to the fact that the high temperature solid is stable up to the first temperature.

In accordance with one development, the glass solder is applied so thinly that the glass solid forms a flexible carrier. This can contribute in a simple manner to forming the glass solid as a flexible carrier.

In accordance with one development, the glass solder is applied in such a way that the glass solid has a thickness in a range of 20 μm to 10 000 μm. The glass solid can have a thickness in a range for example of 50 μm to 1000 μm, for example of 80 μm to 200 μm. This can contribute in a simple manner to forming the glass solid as a flexible carrier.

In accordance with one development, the glass solder is applied to the high temperature solid by means of a print-through method. By way of example, screen printing or blade coating can be used as a print-through method. As an alternative thereto, further conventional printing methods can also be used for applying the glass solder in a structured fashion. This can contribute in a simple manner to applying the glass solder in a structured fashion.

In accordance with one development, the optoelectronic layer structure includes a first electrode above the glass solid, a functional layer structure above the first electrode, and a second electrode above the functional layer structure. This can contribute to forming the optoelectronic layer structure particularly simply and effectively. In addition, the optoelectronic layer structure may include even further layers, for example an insulator layer (resist layer), a metallization, for example for electrically contacting the electrodes, a coupling-out layer, a conversion layer, a scattering layer and/or a mirror layer.

The first electrode can be formed for example in a sputtering process or by means of wet coatings. The insulator layer, the metallization and/or the functional layer structure can be deposited for example by means of sputtering, printing, wet coating or vapor deposition. These processes can be carried out in a vacuum or in atmosphere. Structuring steps are also possible after or during the process of forming the corresponding layer.

In accordance with one development, the functional layer structure includes an organic functional layer structure. By way of example, the functional layer structure consists of the organic functional layer structure.

In accordance with one development, a cover is formed above the optoelectronic layer structure, wherein the optoelectronic component includes the glass body, the optoelectronic layer structure and the cover. The cover contributes to protecting the optoelectronic component against harmful influences from outside. Such harmful influences may be for example mechanical force actions and/or the penetration of air and/or moisture.

In accordance with one development, the cover includes an encapsulation layer above the optoelectronic layer structure. The encapsulation layer can contribute in a simple manner to protecting the optoelectronic component against the harmful external influences.

In accordance with one development, the cover includes the encapsulation layer and a covering body above the encapsulation layer. The encapsulation layer and the covering body can contribute in a simple manner to protecting the optoelectronic component against the harmful external influences. Optionally, the cover may include an adhesion-medium layer by means of which the covering body is fixed to the encapsulation layer.

In accordance with one development, the liquid glass solder is applied to the high temperature solid at at least two different regions and two glass solids physically separated from one another are formed therefrom. Each of the glass solids forms a carrier for a respective optoelectronic component. The high temperature solid is removed after completing the optoelectronic components. Consequently, a plurality of optoelectronic components including corresponding isolated glass solids and corresponding optoelectronic layer structures can be formed in an isolated fashion alongside one another on the high temperature solid and can subsequently be removed from the high temperature solid in a simple manner. This contributes to the method for producing the optoelectronic component being implementable simply and/or cost-effectively.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

Figure 1:
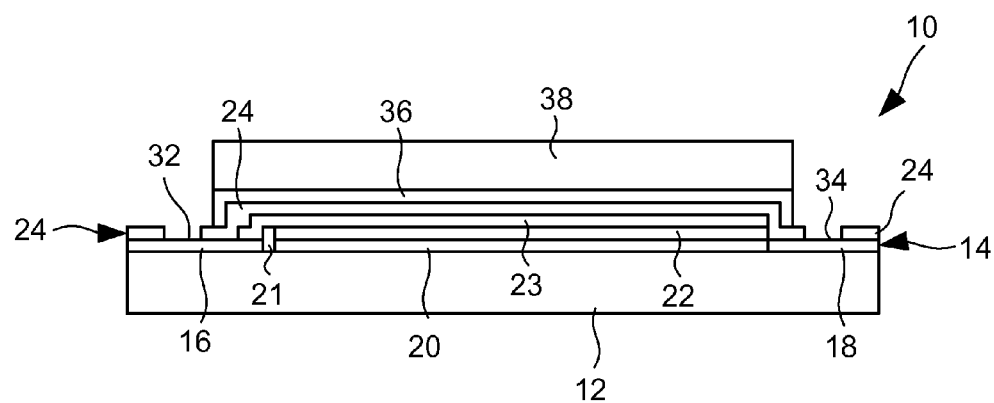
FIG. 1 shows a sectional illustration of one exemplary embodiment of an optoelectronic component.

In the following detailed description, reference is made to the accompanying drawings, which form part of this description and show for illustration purposes specific exemplary embodiments in which various embodiments can be implemented. In this regard, direction terminology such as, for instance, "at the top", "at the bottom", "at the front", "at the back", "front", "rear", etc. is used with respect to the orientation of the figure(s) described. Since component parts of exemplary embodiments can be positioned in a number of different orientations, the direction terminology serves for illustration and is not restrictive in any way whatsoever. It goes without saying that other exemplary embodiments can be used and structural or logical changes can be made, without departing from the scope of protection of the present disclosure. It goes without saying that the features of the various exemplary embodiments described herein can be combined with one another, unless specifically indicated otherwise. Therefore, the following detailed description should not be interpreted in a restrictive sense, and the scope of protection of the present disclosure is defined by the appended claims.

In the context of this description, the terms "connected" and "coupled" are used to describe both a direct and an indirect connection and a direct or indirect coupling. In the figures, identical or similar elements are provided with identical reference signs, insofar as this is expedient.

An optoelectronic component can be an electromagnetic radiation emitting component or an electromagnetic radiation absorbing component. An electromagnetic radiation absorbing component can be for example a solar cell or a photodetector. In various exemplary embodiments, an electromagnetic radiation emitting component can be an electromagnetic radiation emitting semiconductor component and/or can be formed as an electromagnetic radiation emitting diode, as an organic electromagnetic radiation emitting diode, as an electromagnetic radiation emitting transistor or as an organic electromagnetic radiation emitting transistor. The radiation can be light in the visible range, UV light and/or infrared light, for example. In this context, the electromagnetic radiation emitting component can be formed for example as a light emitting diode (LED), as an organic light emitting diode (OLED), as a light emitting transistor or as an organic light emitting transistor. In various exemplary embodiments, the light emitting component can be part of an integrated circuit. Furthermore, a plurality of light emitting components can be provided, for example in a manner accommodated in a common housing.

The connection of a first body to a second body can be positively locking, force-locking and/or cohesive. The connection can be formed as non-releaseable, i.e. irreversible. In this case, a non-releasable connection can be separated only by means of destroying the connection means. An irreversible cohesive connection that is not releasable nondestructively may be for example a riveted connection, an adhesive connection, a fusible connection or a soldered connection. In the case of a cohesive connection, the first body can be connected to the second body by means of atomic and/or molecular forces. Cohesive connections may often be non-releasable connections. A cohesive connection can be realized for example as an adhesive connection, a solder connection, for example of a glass solder or of a metal solder, or as a welded connection.

FIG. 1 shows one exemplary embodiment of an optoelectronic component 10. The optoelectronic component 10 includes a glass solid 12 as carrier. An optoelectronic layer structure is formed on the glass solid 12.

The optoelectronic layer structure includes a first electrode layer 14 including a first contact section 16, a second contact section 18 and a first electrode 20. The second contact section 18 is electrically coupled to the first electrode 20 of the optoelectronic layer structure. The first electrode 20 is electrically insulated from the first contact section 16 by means of an electrical insulation barrier 21. An optically functional layer structure, for example an organic functional layer structure 22, of the optoelectronic layer structure is formed above the first electrode 20. The organic functional layer structure 22 may include for example one, two or more partial layers, as explained in greater detail further below with reference to FIG. 2. A second electrode 23 of the optoelectronic layer structure is formed above the organic functional layer structure 22, said second electrode being electrically coupled to the first contact section 16. The first electrode 20 serves for example as an anode or cathode of the optoelectronic layer structure. In a manner corresponding to the first electrode, the second electrode 23 serves as a cathode or anode of the optoelectronic layer structure.

A cover of the optoelectronic component is formed above the second electrode 23 and partly above the first contact section 16 and partly above the second contact section 18. The cover includes an encapsulation layer 24 encapsulating the optoelectronic layer structure, an adhesion medium layer 36 and a covering body 38.

In the encapsulation layer 24, a first cutout of the encapsulation layer 24 is formed above the first contact section 16 and a second cutout of the encapsulation layer 24 is formed above the second contact section 18. A first contact region 32 is exposed in the first cutout of the encapsulation layer 24 and a second contact region 34 is exposed in the second cutout of the encapsulation layer 24. The first contact region 32 serves for electrically contacting the first contact section 16 and the second contact region 34 serves for electrically contacting the second contact section 18.

The adhesion medium layer 36 is formed above the encapsulation layer 24. The adhesion medium layer 36 includes for example an adhesion medium, for example an adhesive, for example a lamination adhesive, a lacquer and/or a resin. A covering body 38 is formed above the adhesion medium layer 36. The adhesion medium layer 36 serves for fixing the covering body 38 to the encapsulation layer 24. The covering body 38 includes glass and/or metal, for example. For example, the covering body 38 can be formed substantially from glass and include a thin metal layer, for example a metal film, and/or a graphite layer, for example a graphite laminate, on the glass body. The covering body 38 serves for protecting the optoelectronic component 10, for example against mechanical force actions from outside. Furthermore, the covering body 38 can serve for spreading and/or dissipating heat generated in the optoelectronic component 10. By way of example, the glass of the covering body 38 can serve as protection against external actions and the metal layer of the covering body 38 can serve for spreading and/or dissipating the heat that arises during the operation of the optoelectronic component 10.

As an alternative thereto, the optoelectronic component 10 can be formed without a cover, for example without an encapsulation layer 24, without an adhesion medium layer 36 and/or without a covering body 38. Furthermore, the glass solid 12 and the covering body 38 can be formed flush with one another at their lateral outer edges, wherein the contact regions 32, 34 are electrically contactable for example via cutouts and/or holes (not illustrated), in the covering body 38, the adhesion medium layer 36, the encapsulation layer 24 and/or the glass solid 12.

Figure 2:
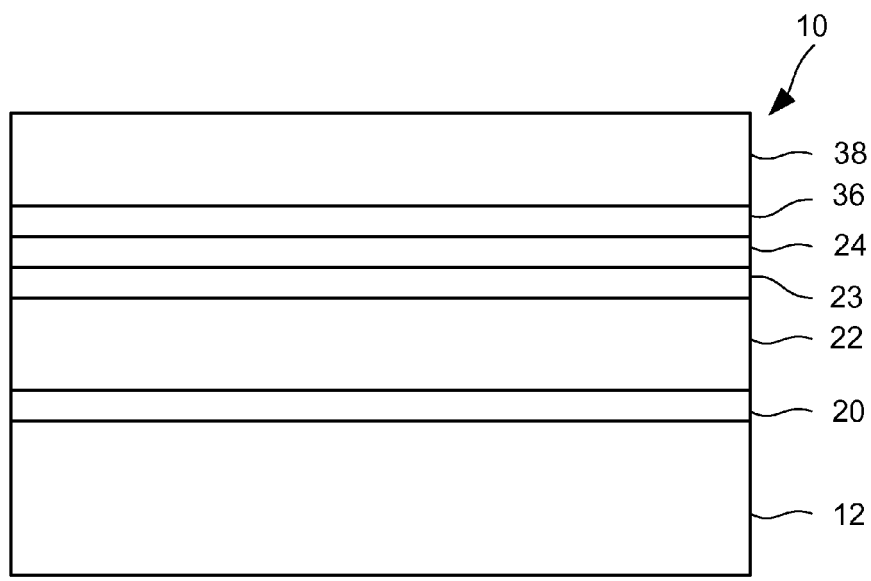
FIG. 2 shows a sectional illustration of a layer structure of one exemplary embodiment of an optoelectronic component.

FIG. 2 shows a detailed sectional illustration of a layer structure of one exemplary embodiment of an optoelectronic component, for example of the optoelectronic component 10 explained above, wherein the contact regions 32, 34 are not illustrated in this detail view. The optoelectronic component 10 can be formed as a top emitter and/or bottom emitter. If the optoelectronic component 10 is formed as a top emitter and bottom emitter, the optoelectronic component 10 can be referred to as an optically transparent component, for example a transparent organic light emitting diode. The optoelectronic component 10 can be flexible, for example. By way of example, the optoelectronic component 10 can be a flexible light emitting diode or a flexible solar cell.

The optoelectronic component 10 includes the glass solid 12 and an active region, in particular the optoelectronic layer structure, above the glass solid 12. A first barrier layer (not illustrated), for example a first barrier thin-film layer, can be formed between the glass solid 12 and the active region. The active region includes the first electrode 20, the organic functional layer structure 22 and the second electrode 23. The encapsulation layer 24 is formed above the active region. The encapsulation layer 24 can be formed as a second barrier layer, for example as a second barrier thin-film layer. The covering body 38 is arranged above the active region and, if appropriate, above the encapsulation layer 24. The covering body 38 can be arranged on the encapsulation layer 24 by means of the adhesion medium layer 36, for example.

The active region is an electrically and/or optically active region. The active region is, for example, that region of the optoelectronic component 10 in which electric current for the operation of the optoelectronic component 10 flows and/or in which electromagnetic radiation is generated or absorbed.

The organic functional layer structure 22 may include one, two or more functional layer structure units and one, two or more intermediate layers between the layer structure units.

The glass solid 12 can be formed as translucent or transparent. The glass solid 12 serves as a carrier for electronic elements or layers, for example light emitting elements. The glass solid 12 may include or be formed from glass, for example. The glass solid 12 can be a part of a mirror structure or form the latter. The glass solid 12 can have a mechanically rigid region and/or a mechanically flexible region or be formed as mechanically rigid, that is to say stiff, or mechanically flexible, that is to say simply nondestructively bendable. The glass solid 12 may include scattering particles. By way of example, the scattering particles can be embedded into the glass solid 12. The glass solid 12 with the scattering particles can serve as a coupling-out layer, for example. In other words, the scattering particles in the glass solid 12 can serve for coupling out light generated in the optoelectronic component 10 and thus contribute to a high efficiency of the optoelectronic component 10.

The first electrode 20 can be formed as an anode or as a cathode. The first electrode 20 can be formed as translucent or transparent. The first electrode 20 includes an electrically conductive material, for example metal and/or a transparent conductive oxide (TCO) or a layer stack of a plurality of layers including metals or TCOs. The first electrode 20 may include for example a layer stack of a combination of a layer of a metal on a layer of a TCO, or vice versa. One example is a silver layer applied on an indium tin oxide (ITO) layer (Ag on ITO) or ITO-Ag-ITO multilayers.

By way of example, Ag, Pt, Au, Mg, Al, Ba, In, Ca, Sm or Li, and compounds, combinations or alloys of these materials can be used as metal.

Transparent conductive oxides are transparent conductive materials, for example metal oxides, such as, for example, zinc oxide, tin oxide, cadmium oxide, titanium oxide, indium oxide, or indium tin oxide (ITO). Alongside binary metal-oxygen compounds, such as, for example, ZnO, $SnO_2$, or $In_2O_3$, ternary metal-oxygen compounds, such as, for example, AlZnO, $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides also belong to the group of TCOs.

The first electrode 20 may include, as an alternative or in addition to the materials mentioned: networks composed of metallic nanowires and nanoparticles, for example composed of Ag, networks composed of carbon nanotubes, graphene particles and graphene layers and/or networks composed of semi-conducting nanowires. By way of example, the first electrode 20 may include or be formed from one of the following structures: a network composed of metallic nanowires, for example composed of Ag, which are combined with conductive polymers, a network composed of carbon nanotubes which are combined with conductive polymers, and/or graphene layers and composites. Furthermore, the first electrode 20 may include electrically conductive polymers or transition metal oxides.

The first electrode 20 can have for example a layer thickness in a range of 10 nm to 500 nm, for example of 25 nm to 250 nm, for example of 50 nm to 100 nm.

The first electrode 20 can have a first electrical terminal, to which a first electrical potential can be applied. The first electrical potential can be provided by an energy source (not illustrated), for example by a current source or a voltage source. Alternatively, the first electrical potential can be applied to the glass solid 12 and the first electrode 20 can be supplied indirectly via the glass solid 12. The first electrical potential can be for example the ground potential or some other predefined reference potential.

The organic functional layer structure 22 may include a hole injection layer, a hole transport layer, an emitter layer, an electron transport layer and/or an electron injection layer.

The hole injection layer can be formed on or above the first electrode 20. The hole injection layer may include or be formed from one or a plurality of the following materials: HAT-CN, Cu(I)pFBz, $MoO_x$, $WO_x$, $VO_x$, $ReO_x$, F4-TCNQ, NDP-2, NDP-9, Bi(III)pFBz, F16CuPc; NPB (N,N'-bis (naphthalen-1-yl)-N,N'-bis(phenyl)benzidine); beta-NPB (N,N'-bis(naphthalen-2-yl)-N,N'-bis(phenyl)benzidine); TPD (N,N'-bis(3-methyl-phenyl)-N,N'-bis(phenyl)benzidine); spiro-TPD (N,N'-bis(3-methylphenyl)-N,N'-bis(phenyl)spiro); DMFL-TPD (N,N'-bis(3-methylphenyl)-N,N'-bis(phenyl)-9,9-dimethylfluorene); DMFL-NPB (N,N'-bis(naphthalen-1-yl)-N,N'-bis-(phenyl)-9,9-dimethylfluorene); DPFL-TPD (N,N'-bis(3-methyl-phenyl)-N,N'-bis(phenyl)-9,9-diphenylfluorene); DPFL-NPB (N,N'-bis(naphthalen-1-yl)-N,N'-bis(phenyl)-9,9-diphenylfluorene); spiro-TAD (2,2',7,7'-tetrakis(N,N-diphenylamino)-9,9'-spirobifluorene); 9,9-bis[4-(N,N-bisbiphenyl-4-ylamino)phenyl]-9H-fluorene; 9,9-bis[4-(N,N-bisnaphthalen-2-ylamino)phenyl]-9H-fluorene; 9,9-bis[4-(N,N'-bisnaphthalen-2-yl-N,N'-bisphenylamino)phenyl]-9H-fluorene; N,N'-bis-(phenanthren-9-yl)-N,N'-bis(phenyl) benzidine; 2,7-bis[N,N-bis(9,9-spirobifluoren-2-yl)amino]-9,9-spirobifluorene; 2,2'-bis[N,N-bis(biphenyl-4-yl)amino]-9,9-spirobifluorene; 2,2'-bis(N,N-diphenylamino)-9,9-spirobifluorene; di[4-(N,N-di-tolylamino)phenyl] cyclohexane; 2,2',7,7'-tetra(N,N-di-tolyl) aminospirobifluorene; and/or N,N,N',N'-tetranaphthalen-2-ylbenzidine.

The hole injection layer can have a layer thickness in a range of approximately 10 nm to approximately 1000 nm, for example in a range of approximately 30 nm to approximately 300 nm, for example in a range of approximately 50 nm to approximately 200 nm.

The hole transport layer can be formed on or above the hole injection layer. The hole transport layer may include or be formed from one or a plurality of the following materials: NPB (N,N'-bis(naphthalen-1-yl)-N,N'-bis(phenyl)benzidine); beta-NPB (N,N'-bis(naphthalen-2-yl)-N,N'-bis(phenyl)-benzidine); TPD (N,N'-bis(3-methylphenyl)-N,N'-bis (phen-yl)benzidine); spiro-TPD (N,N'-bis(3-methylphenyl)-N,N'-bis(phenyl)benzidine); spiro-NPB (N,N'-bis (naphthalen-1-yl)-N,N'-bis(phenyl)spiro); DMFL-TPD (N,N'-bis(3-methylphenyl)-N,N'-bis(phenyl)-9,9-dimethylfluorene); DMFL-NPB (N,N'-bis-(naphthalen-1-yl)-N,N'-bis(phenyl)-9,9-dimethylfluorene); DPFL-TPD (N,N'-bis(3-methylphenyl)-N,N'-bis(phenyl)-9,9-diphenylfluorene); DPFL-NPB (N,N'-bis(naphthalen-1-yl)-N,N'-bis(phenyl)-9,9-diphenylfluorene); spiro-TAD (2,2',7,7'-tetrakis(N,N-diphenylamino)-9,9'-spirobifluorene); 9,9-bis[4-(N,N-bisbiphenyl-4-yl-amino)phenyl]-9H-fluorene; 9,9-bis[4-(N,N-bisnaphthalen-2-ylamino)phenyl]-9H-fluorene; 9,9-bis[4-(N,N'-bisnaphthalen-2-yl-N,N'-bisphenylamino)phenyl]-9H-fluorene; N,N'-bis(phenanthren-9-yl)-N,N'-bis(phenyl)-benzidine; 2,7-bis[N,N-bis(9,9-spirobifluoren-2-yl)amino]-9,9-spirobifluorene; 2,2'-bis[N,N-bis(biphenyl-4-yl)amino]-9,9-spirobifluorene; 2,2'-bis(N,N-diphenylamino)-9,9-spirobifluorene; di[4-(N,N-ditolylamino)phenyl] cyclohexane; 2,2',7,7'-tetra(N,N-ditolyl) aminospirobifluorene; and N,N,N',N'-tetranaphthalen-2-ylbenzidine.

The hole transport layer can have a layer thickness in a range of approximately 5 nm to approximately 50 nm, for example in a range of approximately 10 nm to approximately 30 nm, for example approximately 20 nm.

One or a plurality of emitter layers, for example including fluorescent and/or phosphorescent emitters, can be formed on or above the hole transport layer. The emitter layer may include organic polymers, organic oligomers, organic monomers, organic small, non-polymeric molecules ("small molecules") or a combination of these materials. The emitter layer may include or be formed from one or a plurality of the following materials: organic or organometallic compounds such as derivatives of polyfluorene, polythiophene and polyphenylene (e.g. 2- or 2,5-substituted poly-p-phenylene vinylene) and metal complexes, for example iridium complexes such as blue phosphorescent FIrPic (bis(3,5-difluoro-2-(2-pyridyl)phenyl(2-carboxypyridyl) iridium III), green phosphorescent Ir(ppy)3 (tris(2-phenylpyridine)iridium III), red phosphorescent Ru (dtb-bpy)3*2(PF6) (tris[4,4'-di-tert-butyl-(2,2')-bipyridine]ruthenium(III) complex) and blue fluorescent DPAVBi (4,4-bis[4-(di-p-tolylamino)styryl]-biphenyl), green fluorescent TTPA (9,10-bis[N,N-di(p-tolyl)-amino]anthracene) and red fluorescent DCM2 (4-dicyanomethylene)-2-methyl-6-julolidyl-9-enyl-4H-pyran) as non-polymeric emitters. Such non-polymeric emitters can be deposited for example by means of thermal evaporation. Furthermore, polymer emitters can be used which can be deposited for example by means of a wet-chemical method, such as, for example, a spin coating method. The emitter materials can be embedded in a suitable manner in a matrix material, for example a technical ceramic or a polymer, for example an epoxy, or a silicone.

The first emitter layer can have a layer thickness in a range of approximately 5 nm to approximately 50 nm, for example in a range of approximately 10 nm to approximately 30 nm, for example approximately 20 nm.

The emitter layer may include emitter materials that emit in one color or in different colors (for example blue and yellow or blue, green and red). Alternatively, the emitter layer may include a plurality of partial layers which emit light of different colors. By means of mixing the different colors, the emission of light having a white color impression can result. Alternatively or additionally, provision can be made for arranging a converter material in the beam path of the primary emission generated by said layers, which converter material at least partly absorbs the primary radiation and emits a secondary radiation having a different wavelength, such that a white color impression results from a (not yet white) primary radiation by virtue of the combination of primary radiation and secondary radiation.

The electron transport layer can be formed, for example deposited, on or above the emitter layer. The electron transport layer may include or be formed from one or a plurality of the following materials: NET-18; 2,2',2"-(1,3,5-benzinetriyl)tris(1-phenyl-1H-benzimidazole); 2-(4-biphenylyl)-5-(4-tert-butylphenyl)-1,3,4-oxadiazole, 2,9-dimethyl-4,7-diphenyl-1,10-phenanthroline (BCP); 8-hydroxyquinolinolato lithium; 4-(naphthalen-1-yl)-3,5-diphenyl-4H-1,2,4-triazole; 1,3-bis[2-(2,2'-bipyridin-6-yl)-1,3,4-oxadiazo-5-yl]benzene; 4,7-diphenyl-1,10-phenanthroline (BPhen); 3-(4-biphenylyl)-4-phenyl-5-tert-butylphenyl-1,2,4-triazole; bis(2-methyl-8-quinolinolate)-4-(phenylphenolato)aluminum; 6,6'-bis[5-(biphenyl-4-yl)-1,3,4-oxadiazo-2-yl]-2,2'-bipyridyl; 2-phenyl-9,10-di(naphthalen-2-yl)anthracene; 2,7-bis[2-(2,2'-bipyridin-6-yl)-1,3,4-oxadiazo-5-yl]-9,9-dimethylfluorene; 1,3-bis[2-(4-tert-butylphenyl)-1,3,4-oxadiazo-5-yl]benzene; 2-(naphthalen-2-yl)-4,7-diphenyl-1,10-phenanthroline; 2,9-bis(naphthalen-2-yl)-4,7-diphenyl-1,10-phenanthroline; tris(2,4,6-trimethyl-3-(pyridin-3-yl)phenyl)borane; 1-methyl-2-(4-(naphthalen-2-yl)phenyl)-1H-imidazo-[4,5-f][1,10]phenanthroline; phenyldipyrenylphosphine oxide; naphthalenetetracarboxylic dianhydride or the imides thereof; perylenetetracarboxylic dianhydride or the imides thereof; and substances based on silols including a silacyclo-pentadiene unit.

The electron transport layer can have a layer thickness in a range of approximately 5 nm to approximately 50 nm, for example in a range of approximately 10 nm to approximately 30 nm, for example approximately 20 nm.

The electron injection layer can be formed on or above the electron transport layer. The electron injection layer may include or be formed from one or a plurality of the following materials: NDN-26, MgAg, $Cs_2CO_3$, $Cs_3PO_4$, Na, Ca, K, Mg, Cs, Li, LiF; 2,2',2"-(1,3,5-benzinetriyl)tris(1-phenyl-1H-benzimidazole); 2-(4-biphenylyl)-5-(4-tert-butylphenyl)-1,3,4-oxadiazole, 2,9-dimethyl-4,7-diphenyl-1,10-phenanthroline (BCP); 8-hydroxyquinolinolato lithium, 4-(naphthalen-1-yl)-3,5-diphenyl-4H-1,2,4-triazole; 1,3-bis[2-(2,2'-bipyridin-6-yl)-1,3,4-oxadiazo-5-yl]benzene; 4,7-diphenyl-1,10-phenanthroline (BPhen); 3-(4-biphenylyl)-4-phenyl-5-tert-butylphenyl-1,2,4-triazole; bis(2-methyl-8-quinolinolate)-4-(phenylphenolato)aluminum; 6,6'-bis[5-(biphenyl-4-yl)-1,3,4-oxadiazo-2-yl]-2,2'-bipyridyl; 2-phenyl-9,10-di(naphthalen-2-yl)anthracene; 2,7-bis[2-(2,2'-bipyridin-6-yl)-1,3,4-oxadiazo-5-yl]-9,9-dimethylfluorene; 1,3-bis[2-(4-tert-butylphenyl)-1,3,4-oxadiazo-5-yl]benzene; 2-(naphthalen-2-yl)-4,7-diphenyl-1,10-phenanthroline; 2,9-bis(naphthalen-2-yl)-4,7-diphenyl-1,10-phenanthroline; tris(2,4,6-trimethyl-3-(pyridin-3-yl)phenyl)borane; 1-methyl-2-(4-(naphthalen-2-yl)phenyl)-1H-imidazo[4,5-f][1,10]phenanthroline; phenyldipyrenylphosphine oxide; naphthalenetetracarboxylic dianhydride or the imides thereof; perylenetetracarboxylic dianhydride or the imides thereof; and substances based on silols including a silacyclo-pentadiene unit.

The electron injection layer can have a layer thickness in a range of approximately 5 nm to approximately 200 nm, for example in a range of approximately 20 nm to approximately 50 nm, for example approximately 30 nm.

In the case of an organic functional layer structure 22 including two or more organic functional layer structure units, corresponding intermediate layers can be formed between the organic functional layer structure units. The organic functional layer structure units can be formed in each case individually by themselves in accordance with a configuration of the organic functional layer structure 22 explained above. The intermediate layer can be formed as an intermediate electrode. The intermediate electrode can be electrically connected to an external voltage source. The external voltage source can provide a third electrical potential, for example, at the intermediate electrode. However, the intermediate electrode can also have no external electrical terminal, for example by the intermediate electrode having a floating electrical potential.

The organic functional layer structure unit can have for example a layer thickness of a maximum of approximately 3 μm, for example a layer thickness of a maximum of approximately 1 μm, for example a layer thickness of a maximum of approximately 300 nm.

The optoelectronic component 10 can optionally include further functional layers, for example arranged on or above the one or the plurality of emitter layers or on or above the electron transport layer. The further functional layers can be for example internal or external coupling-in/coupling-out structures that can further improve the functionality and thus the efficiency of the optoelectronic component 10.

The second electrode 23 can be formed in accordance with one of the configurations of the first electrode 20, wherein the first electrode 20 and the second electrode 23 can be formed identically or differently. The second electrode 23 can be formed as an anode or as a cathode. The second electrode 23 can have a second electrical terminal, to which a second electrical potential can be applied. The second electrical potential can be provided by the same energy source as, or a different energy source than, the first electrical potential. The second electrical potential can be different than the first electrical potential. The second electrical potential can have for example a value such that the difference with respect to the first electrical potential has a value in a range of approximately 1.5 V to approximately 20 V, for example a value in a range of approximately 2.5 V to approximately 15 V, for example a value in a range of approximately 3 V to approximately 12 V.

The encapsulation layer 24 can also be designated as thin-film encapsulation. The encapsulation layer 24 can be formed as a translucent or transparent layer. The encapsulation layer 24 forms a barrier against chemical impurities or atmospheric substances, in particular against water (moisture) and oxygen. In other words, the encapsulation layer 24 is formed in such a way that substances that can damage the optoelectronic component, for example water, oxygen or solvent, cannot penetrate through it or at most very small proportions of said substances can penetrate through it. The encapsulation layer 24 can be formed as an individual layer, a layer stack or a layer structure.

The encapsulation layer 24 may include or be formed from: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, poly(p-phenyleneterephthalamide), nylon 66, and mixtures and alloys thereof.

The encapsulation layer 24 can have a layer thickness of approximately 0.1 nm (one atomic layer) to approximately 1000 nm, for example a layer thickness of approximately 10 nm to approximately 100 nm, for example approximately 40 nm. The encapsulation layer 24 may include a high refractive index material, for example one or a plurality of material(s) having a high refractive index, for example having a refractive index of 1.5 to 3, for example of 1.7 to 2.5, for example of 1.8 to 2.

Optionally, the first barrier layer can be formed on the glass solid 12 in a manner corresponding to a configuration of the encapsulation layer 24.

The encapsulation layer 24 can be formed for example by means of a suitable deposition method, e.g. by means of an atomic layer deposition (ALD) method, e.g. a plasma enhanced atomic layer deposition (PEALD) method or a plasmaless atomic layer deposition (PLALD) method, or by means of a chemical vapor deposition (CVD) method, e.g. a plasma enhanced chemical vapor deposition (PECVD) method or a plasmaless chemical vapor deposition (PLCVD) method, or alternatively by means of other suitable deposition methods.

If appropriate, a coupling-in or coupling-out layer can be formed for example as an external film (not illustrated) on the glass solid 12 or as an internal coupling-out layer (not illustrated) in the layer cross section of the optoelectronic component 10. The coupling-in/-out layer may include a matrix and scattering centers distributed therein, wherein the average refractive index of the coupling-in/-out layer is greater than the average refractive index of the layer from which the electromagnetic radiation is provided. Furthermore, in addition, one or a plurality of antireflection layers can be formed.

The adhesion medium layer 36 may include adhesive and/or lacquer, for example, by means of which the covering body 38 is arranged, for example adhesively bonded, on the encapsulation layer 24, for example. The adhesion medium layer 36 can be formed as transparent or translucent. The adhesion medium layer 36 may include for example particles which scatter electromagnetic radiation, for example light-scattering particles. As a result, the adhesion medium layer 36 can act as a scattering layer and lead to an improvement in the color angle distortion and the coupling-out efficiency.

The scattering particles, in particular light-scattering particles, provided can be dielectric scattering particles, for example composed of a metal oxide, for example silicon oxide ($SiO_2$), zinc oxide (ZnO), zirconium oxide ($ZrO_2$), indium tin oxide (ITO) or indium zinc oxide (IZO), gallium oxide ($Ga_2O_x$), aluminum oxide, or titanium oxide. Other particles may also be suitable provided that they have a refractive index that is different than the effective refractive index of the matrix of the adhesion medium layer 36, for example air bubbles, acrylate, or hollow glass beads. Furthermore, by way of example, metallic nanoparticles, metals such as gold, silver, iron nanoparticles, or the like can be provided as light-scattering particles.

The adhesion medium layer 36 can have a layer thickness of greater than 1 μm, for example a layer thickness of a plurality of μm. In various exemplary embodiments, the adhesive can be a lamination adhesive.

The adhesion medium layer 36 can have a refractive index that is less than the refractive index of the covering body 38. The adhesion medium layer 36 may include for example a low refractive index adhesive such as, for example, an acrylate having a refractive index of approximately 1.3. However, the adhesion medium layer 36 can also include a high refractive index adhesive which for example includes high refractive index, non-scattering particles and has a layer-thickness-averaged refractive index that approximately corresponds to the average refractive index of the organic functional layer structure 22, for example in a range of approximately 1.6 to 2.5, for example of 1.7 to approximately 2.0.

A so-called getter layer or getter structure, i.e. a laterally structured getter layer, can be arranged (not illustrated) on or above the active region. The getter layer can be formed as translucent, transparent or opaque. The getter layer may include or be formed from a material that absorbs and binds substances that are harmful to the active region. A getter layer may include or be formed from a zeolite derivative, for example. The getter layer can have a layer thickness of greater than 1 μm, for example a layer thickness of a plurality of μm. In various exemplary embodiments, the getter layer may include a lamination adhesive or be embedded in the adhesion medium layer 36.

The covering body 38 can be formed for example by a glass body, a metal film or a sealed plastics film covering body. The covering body 38 can be arranged on the encapsulation layer 24 or the active region for example by means of frit bonding (glass frit bonding/glass soldering/seal glass bonding) by means of a conventional glass solder in the geometrical edge regions of the optoelectronic component 10. The covering body 38 can have for example a refractive index (for example at a wavelength of 633 nm) of for example 1.3 to 3, for example of 1.4 to 2, for example of 1.5 to 1.8.

The states shown in the following figures, in particular the shown states of an optoelectronic component, represent individual method steps of the method for producing the corresponding optoelectronic component, in particular the optoelectronic component 10 explained above.

Figure 3:
FIG. 3 shows a first state during one exemplary embodiment of a method for producing the optoelectronic component.

FIG. 3 shows a first state during the method for producing the optoelectronic component 10. In particular, FIG. 3 shows a plan view of a high temperature solid 40 for forming the optoelectronic component 10. The high temperature solid 40 serves for forming the optoelectronic component 10 above the high temperature solid 40. The high temperature solid 40 is formed integrally and/or in an isolated fashion.

The high temperature solid consists of graphite. The high temperature solid 40 is stable at least up to a first temperature. That means that the high temperature solid 40 is thermally stable. The fact that the high temperature solid 40 is thermally stable means that it has a softening temperature and a melting point which both lie above the first temperature, and that the high temperature solid 40 is in a solid state of matter below the first temperature. The first temperature can be in a range of for example 600° C. to 5000° C., for example of 600° C. to 1500° C., for example of 650° C. to 1000° C.

The fact that the high temperature solid 40 is stable can further mean that it is chemically stable and therefore does not establish a cohesive connection with many materials or only with specific materials, for example with glass solder.

Alternatively, the high temperature solid may include for example graphite, ceramic and/or aluminum oxide, for example $Al_2O_3$, or consist of ceramic or aluminum oxide. As an alternative thereto, the high temperature solid 40 can consist of a plurality of parts or be formed continuously in accordance with an assembly line.

Figure 4:
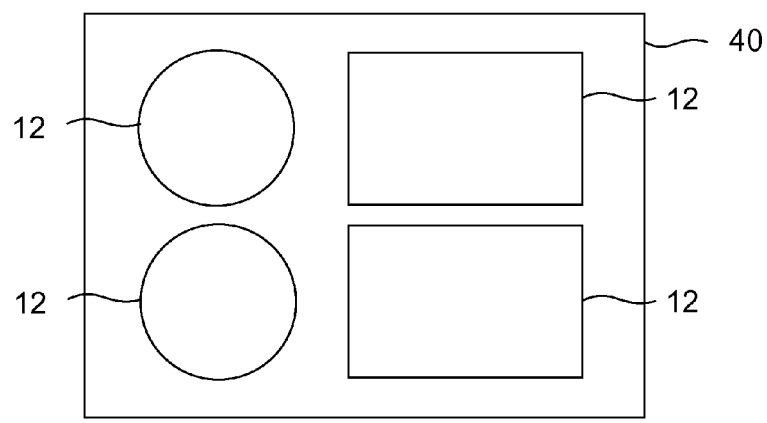
FIG. 4 shows a second state during one exemplary embodiment of a method for producing the optoelectronic component.

FIG. 4 shows a second state during the method for producing the optoelectronic component 10.

Glass solder is applied to the high temperature solid 40 in a structured fashion in four different non-continuous regions, in particular in the form of two circles and two rectangles in plan view. The glass solder is applied to the high temperature solid 40 in a structured fashion in a printing method, in particular by means of a print-through method, for example by means of screen printing. The glass solder is in a liquid state of matter during application to the high temperature solid 40. The glass solder can have for example a second temperature in a range for example of 500° C. to 1200° C., for example of 500° C. to 800° C., for example of 520° C. to 650° C.

The glass solder situated on the high temperature solid 40 is solidified, in particular vitrified, for example by means of drying and/or hardening of the glass solder. The solidification of the glass solder can be carried out in a furnace process, for example. The glass solder in the solidified state forms four corresponding glass solids 12 on the high temperature solid 40. In particular, four isolated glass solids 12 are formed in the state shown in FIG. 4. The isolated glass solids 12 do not touch one another and/or are coupled to one another only via the high temperature solid 40.

The glass solids 12 can be formed so thinly that they each form a flexible carrier. The glass solder can be applied for example in such a way that the glass solids 12 have a thickness in a range for example of 20 μm to 10 000 μm, for example of 50 μm to 1000 μm, for example of 80 μm to 200 μm.

The softening temperature and/or the melting point of the high temperature solid 40 can be for example greater than a softening temperature and/or melting point of the glass solder. The first temperature is greater than the second temperature, wherein the material and the temperature of the liquid glass solder and the material and the thermal stability of the high temperature solid 40 can be correspondingly coordinated with one another.

Alternatively, glass solder can be applied to the high temperature solid 40 only in one, two or three or in more than four regions. Furthermore, the structure of the applied glass solder can be a different structure; by way of example, the glass solder can be applied in an oval, polygonal, triangular, pentagonal or polygonal fashion in plan view. Furthermore, the glass solder can be applied to the high temperature solid 40 in a structured fashion by means of a different printing method, in particular by means of a different print-through method, for example by means of blade coating, stencil printing, or by means of dispensing. Furthermore, the glass solids 12 can be formed so thickly that they are not flexible, but rather rigid and/or stiff.

Figure 5:
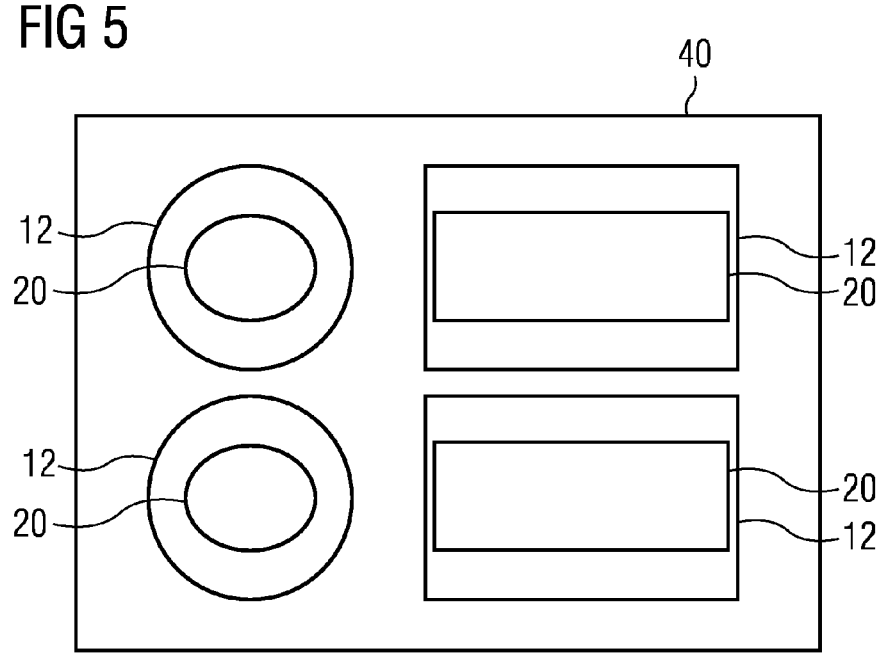
FIG. 5 shows a third state during one exemplary embodiment of a method for producing the optoelectronic component.

FIG. 5 shows a third state during the method for producing the optoelectronic component 10. A first electrode layer 14, in particular a first electrode 20, is respectively formed on the glass solids 12. The first electrode 20 includes ITO, for example. The shape of the first electrode 20 corresponds to the shape of the corresponding glass solid 12.

The first electrode 20 is firstly formed over the whole area in a sputtering method and then structured by means of a laser.

As an alternative thereto, the first electrode 20 can be applied to the glass solid 12 in a finished structured fashion, for example using a corresponding mask. Furthermore, the first electrode 20 can be formed by means of a different coating method, for example by means of vapor deposition. Furthermore, it is possible for the shapes of the glass solids 12 and of the first electrodes 20 not to correspond to one another and to deviate from one another. By way of example, an angular first electrode 20 can be formed on a roundish glass solid 12, or a roundish first electrode 20 can be formed on an angular glass solid 12.

Figure 6:
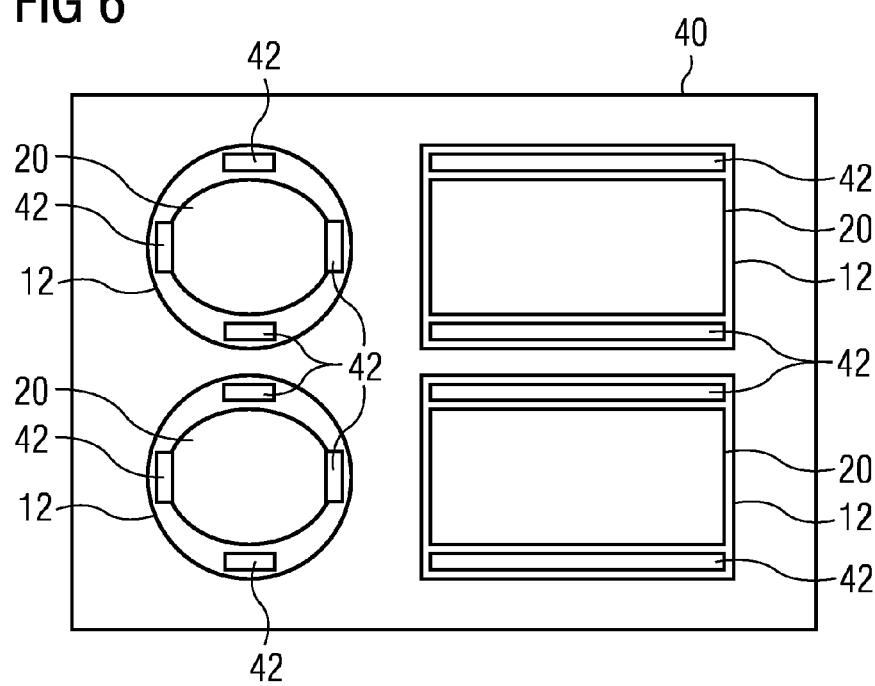
FIG. 6 shows a fourth state during one exemplary embodiment of a method for producing the optoelectronic component.

FIG. 6 shows a fourth state during the method for producing the optoelectronic component 10. Metallizations 42, in particular a plurality of metal layers, are formed on the glass solid 12 and on the first electrode 20. The metallizations 42 are formed in edge regions of the corresponding glass solids 12 and/or of the corresponding first electrodes 20. Forming the metallizations 42 is optional. The optoelectronic component 10 can thus also be formed in such a way that the metallizations 42 can be dispensed with.

The metallizations 42 serve for electrically contacting the first electrode 20 and/or the second electrode 23, not yet formed in this state.

The metallizations 42 are applied in a printing method and subsequently hardened and/or dried. The metallizations 42 applied by printing may include or be formed from silver and/or copper, for example.

As an alternative thereto, the metallizations 42 can be formed by means of other methods, for example by means of sputtering or by means of vapor deposition. The metallizations applied by means of sputtering may include for example chromium, aluminum and/or molybdenum, for example one or a plurality of stacks of layers in accordance with the order chromium/aluminum/chromium or molybdenum/aluminum/molybdenum.

Figure 7:
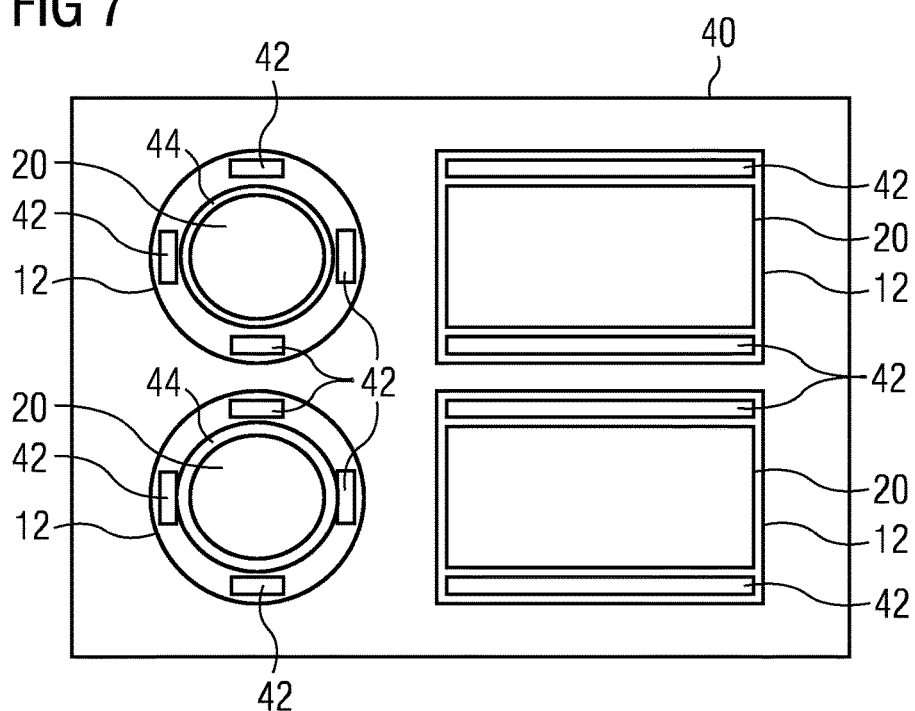
FIG. 7 shows a fifth state during one exemplary embodiment of a method for producing the optoelectronic component.

FIG. 7 shows a fifth state during the method for producing the optoelectronic component 10. At least in part corresponding insulator layers 44 are formed above the metallizations 42 and first electrodes 20. The insulator layers 44 can serve for example to electrically insulate the two electrodes 20, 23 from one another or to particularly define edges of layers. Forming the insulator layers 44 is optional. The optoelectronic component 10 can thus also be formed such that the insulator layers 44 can be dispensed with.

The insulator layers 44 are formed in a structured fashion by means of printing, in particular by means of inkjet printing, and are subsequently hardened.

Alternatively, the insulator layers 44 can be formed by means of a different method, for example by means of vapor deposition.

The glass bodies 12 with the electrodes 20, the metallizations 42 and the insulator layers 44 can also be referred to as substrates. The substrates serve as carrier elements for forming the functional layer structures, in particular the organic functional layer structures 22.

Figure 8:
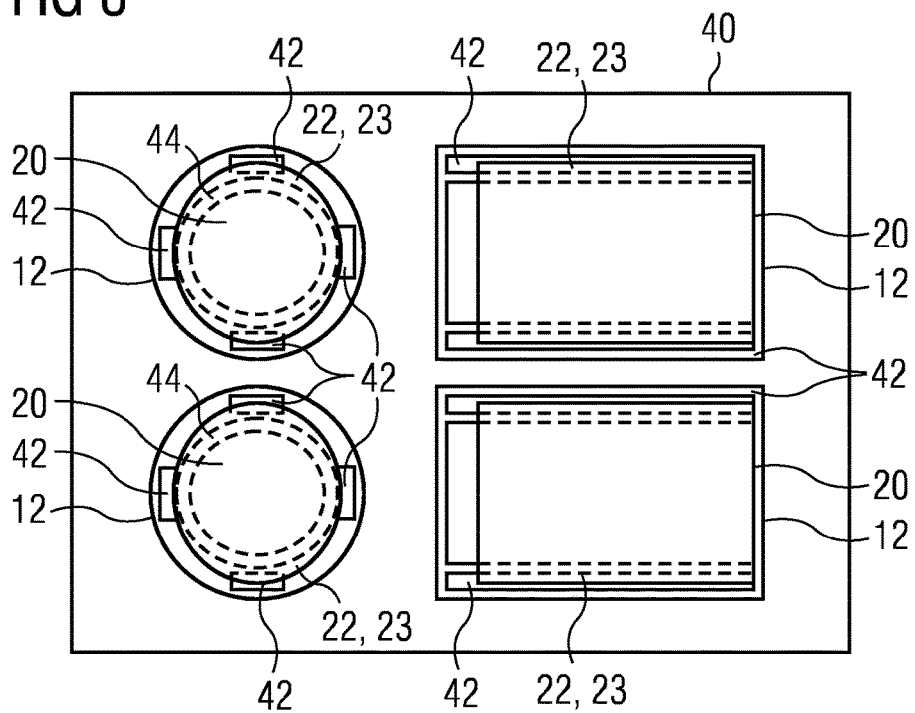
FIG. 8 shows a sixth state during one exemplary embodiment of a method for producing the optoelectronic component.

FIG. 8 shows a sixth state during the method for producing the optoelectronic component 10. Above the glass solids 12, the first electrode 20, the metallizations 42 and/or the insulator layers 44, there are formed the organic functional layer structures 22 and thereabove the second electrodes 23, wherein the latter are illustrated as translucent in FIG. 8.

In order to form the organic functional layer structures 22, the high temperature solid 40 with the substrates can be arranged in a vacuum installation in which the organic layers of the organic functional layer structures 22 can be formed, in particular by vapor deposition.

The second electrodes 23 can be formed by means of a process such as was described above in connection with forming the first electrodes 20.

Afterward, the optoelectronic components 10 are encapsulated, in particular by means of the cover. The cover may include the encapsulation layer 24, the adhesion medium layer 36 and/or the covering body 38. In other words, the encapsulation layers 24 are formed above the second electrodes 23. Optionally, the adhesion medium layers 36 and/or the covering bodies 38 can also be formed above the second electrodes 23 and/or the encapsulation layers 24.

The cover is formed in such a way, in particular so thinly and/or with such a constitution, that it is flexible, that is to say simply nondestructively bendable. In this regard, the flexible glass solids 12, the optoelectronic layer structures and the flexible covers respectively form a flexible optoelectronic component 10.

As an alternative thereto, the cover can be formed in a rigid and/or stiff fashion and the optoelectronic components 10 can be formed correspondingly in a rigid and/or stiff fashion.

Figure 9:
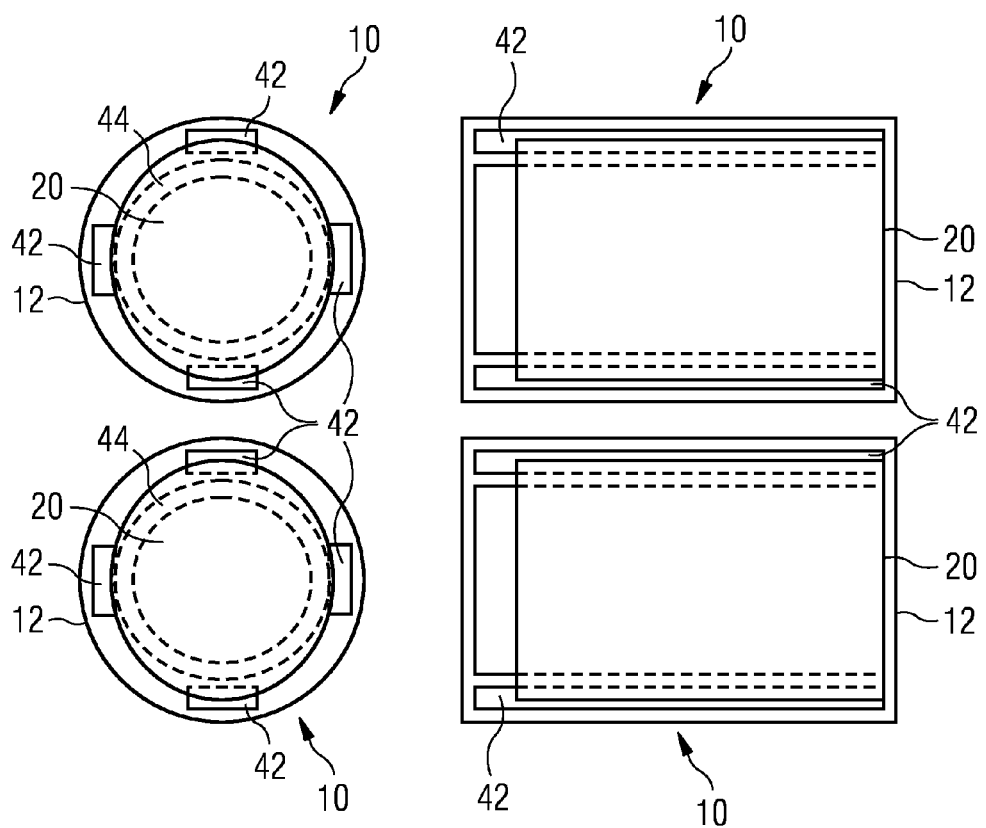
FIG. 9 shows a seventh state during one exemplary embodiment of a method for producing the optoelectronic component.

FIG. 9 shows a seventh state during the method for producing the optoelectronic component 10. In the seventh state, the optoelectronic components 10 are completed and the high temperature solid 40 is removed. Since no cohesive connection between the high temperature solid 40 and the optoelectronic components 10, in particular the glass solids 12, arises during the method for producing the optoelectronic component 10, the optoelectronic components 10 can be simply removed from the high temperature solid 40.

If the optoelectronic components 10 have to be introduced into different installations during the method for producing the optoelectronic component 10, then the optoelectronic components 10 can be transported and handled in a simple manner by means of the high temperature solid 40. Optionally, the high temperature solid 40 may include transport and/or holding elements (not illustrated) which simplify the transport between the installations and/or the arrangement in the installations. Optionally after the end of the method for producing the optoelectronic component 10 the high temperature solid 40 can be reused for producing further optoelectronic components 10.

The disclosure is not restricted to the exemplary embodiments indicated. By way of example, more or fewer optoelectronic components 10 can be formed above the high temperature solid 40. Furthermore, a plurality of high temperature solids 40 with corresponding optoelectronic components 10 can be provided. Furthermore, the optoelectronic components 10 can have in plan view different structures than those shown in the figures. Furthermore, all the optoelectronic components 10 can have the same shape. Furthermore, in addition to the states shown, during the method for producing the optoelectronic component 10, intermediate states (not shown) can be assumed in which, for example, diverse intermediate layers and/or functional layers explained above can be formed.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A method for producing an optoelectronic component, comprising:
    providing a high temperature solid which is stable at least up to a predefined first temperature;
    applying a liquid glass solder having a second temperature, which is lower than the first temperature, to the high temperature solid in a structured fashion;
    solidifying the glass solder, as a result of which a glass solid is formed;
    forming an optoelectronic layer structure above the glass solid, wherein the glass solid and the optoelectronic layer structure form the optoelectronic component; and
    removing the optoelectronic component from the high temperature solid.

2. The method as claimed in claim 1, wherein said stability up to the first temperature prevents a cohesive connection between the high temperature solid and the glass solder and/or the glass solid.

3. The method as claimed in claim 1, wherein scattering particles are embedded into the liquid glass solder, and wherein the embedded scattering particles together with the glass solder are applied to the high temperature solid and are subsequently embedded in the glass solid.

4. The method as claimed in claim 1, wherein the glass solder is applied to the high temperature solid such that the glass solid is isolated on the high temperature solid.

5. The method as claimed in claim 1, wherein the high temperature solid comprises graphite.

6. The method as claimed in claim 1, wherein the high temperature solid comprises ceramic.

7. The method as claimed in claim 1, wherein the glass solder is applied so thinly that the glass solid forms a flexible carrier.

8. The method as claimed in claim 1, wherein the glass solder is applied in such a way that the glass solid has a thickness in a range of 20 μm to 10 000 μm.

9. The method as claimed in claim 1, wherein the glass solder is applied to the high temperature solid in a structured fashion by means of a print-through method.

10. The method as claimed in claim 1, wherein the optoelectronic layer structure comprises a first electrode above the glass solid, a functional layer structure above the first electrode, and a second electrode above the functional layer structure.

11. The method as claimed in claim 10, wherein the functional layer structure comprises an organic functional layer structure.

12. The method as claimed in claim 1, wherein a cover is formed above the optoelectronic layer structure, wherein the optoelectronic component comprises the glass solid, the optoelectronic layer structure and the cover.

13. The method as claimed in claim 12, wherein the cover comprises an encapsulation layer above the optoelectronic layer structure.

14. The method as claimed in claim 13, wherein the cover comprises the encapsulation layer and a covering body above the encapsulation layer.

15. The method as claimed in claim 1, wherein
    the liquid glass solder is applied to the high temperature solid at at least two different regions and two glass solids physically separated from one another are formed therefrom, each of the glass solids forms a carrier for a respective optoelectronic component, and
the high temperature solid is removed after completing the optoelectronic components.

* * * * *